United States Patent [19]

Kumar et al.

[11] Patent Number: 4,493,856
[45] Date of Patent: Jan. 15, 1985

[54] SELECTIVE COATING OF METALLURGICAL FEATURES OF A DIELECTRIC SUBSTRATE WITH DIVERSE METALS

[75] Inventors: Ananda H. Kumar; Kris V. Srikrishnan, both of Wappingers Falls, N.Y.

[73] Assignee: International Business Machines Corporation, Armonk, N.Y.

[21] Appl. No.: 359,469

[22] Filed: Mar. 18, 1982

[51] Int. Cl.³ .................. B05D 3/00; B05D 3/02; B05D 3/12; B05D 5/00
[52] U.S. Cl. .................................. 427/57; 427/42; 427/96; 427/99; 427/264; 427/266
[58] Field of Search .................. 427/57, 96, 99, 374.4, 427/42, 264–266

[56] References Cited

U.S. PATENT DOCUMENTS

| | | |
|---|---|---|
| 3,186,863 | 6/1965 | Foley, Jr. |
| 3,512,051 | 5/1970 | Noll .................................. 317/234 |
| 3,554,793 | 1/1971 | Krieger |
| 3,698,408 | 10/1972 | Jacke .................................. 134/122 |
| 3,698,941 | 10/1972 | De Nobel et al. |
| 3,736,167 | 5/1973 | Bachman et al. |
| 3,979,858 | 9/1976 | Semones et al. ........................ 51/316 |
| 4,206,254 | 6/1980 | Schmecknebecher .............. 427/259 |

OTHER PUBLICATIONS

IBM TDB, vol. 15, No. 9, Feb. 1973, p. 2855, "Selective Metallization of Ceramic Substrates", Kaus et al.
IBM TDB, vol. 17, No. 2, Jul. 1974, p. 452, Removing Quartz Flakes from Surfaces by Sound Energy, Hafner et al.

Primary Examiner—Evan K. Lawrence
Attorney, Agent, or Firm—Henry Powers

[57] ABSTRACT

A method of coating or cladding existing metallurgical features of a dielectric substrate by sequentially blanket coating the substrate with two discrete levels of diverse metals having differential in melting point and forming a continuous series of alloy solid solutions whose solidus curve lies intermediate the melting points of the two component metals, with the metal having the lower melting point disposed adjacent said substrate, followed by heating of the substrate to a temperature slightly above melting point of the lower melting metal but not exceeding the liquidus temperature of a completely homogenized alloy corresponding to amounts of the metals deposited, with cooling of the substrate to delaminate the metal coatings on the bare surface areas of said substrate, and mechanically removing said delaminated metal coatings to retain a bonded cladding comprised of said metals on said metallurgical features.

19 Claims, 5 Drawing Figures

SELECTIVE COATING OF METALLURGICAL FEATURES OF A DIELECTRIC SUBSTRATE WITH DIVERSE METALS

DESCRIPTION

Related Applications

Concurrent U.S. applications Ser. No. 359,445 filed Mar. 18, 1982 by A. H. Kumar for "Thin Film Floating Zone Metal Coating Technique"; and U.S. Ser. No. 359,444 filed Mar. 18, 1982 for "Maskless Coating of Metallurgical Features of a Dielectric Substrate" by A. H. Kumar, U.S. Pat. No. 4,442,137.

TECHNICAL FIELD

This invention relates to a method of depositing and bonding metal coatings on an existing metallurgy pattern of a dielectric substrate, and more particularly for coating solderable and brazeable protective coatings on refractory metal conductor features of a ceramic substrate employed for mounting semiconductor devices thereon.

Accordingly, it is an object of the present invention to provide a novel method for metal cladding or capping existing metallurgical patterns of a dielectric substrate.

It is another object of this invention to provide a novel method of selectively depositing and bonding a diverse metal coating on an existing metal pattern of a dielectric substrate.

A further object of this invention is to provide a novel maskless method for metal coating an existing pattern of a dielectric substrate with a diverse metal.

A still further object of this invention is to provide a novel method for fabrication of improved metallized dielectric substrate carriers for mounting of semiconductor devices thereon.

It is another object of this invention to provide a maskless method for cladding sintered refractory metal circuit features of ceramic substrates with a solderable and brazeable coating for connection to terminal contacts of a integrated circuit devices and to input-/output (I/O) pins.

BACKGROUND ART

The multi-layer ceramic (MLC) technology for fabricating dielectric substrate carriers for integrated circuit/semiconductor package assemblies is well known. Such MLC substrates are produced by preparing a slurry of a suitable ceramic particulates (e.g. alumin), a fugitive resin binder material, a solvent for the resin binder, normally with an included plasticizer; doctor blading the slurry on removable base with subsequent drying to form thin flexible sheets commonly termed ceramic green sheets. The sheets are then punched to form via holes, and the via holes filled with conductive metalliferous (e.g. molybdenum) paste which is also formed into a pattern of conductive lines which will ultimately form the internal circuitry of the MLC. The punched and printed green sheets are selectively stacked on each other into a laminated substrate assembly, as for example, a stack of 15 to 30 green sheets, and the assembly sintered to integrate the sheets and develop the conductor pattern while removing the binder. The resultant fired MLC substrate can then be employed for flip-chip mounting of semiconductor devices which are electrically connected to the internal circuitry of the MLC substrate.

External contact with the MLC substrate is made by a plurality of I/O pins normally brazed or otherwise mounted to the opposite side of the MLC substrate to the internal circuitry thereof. It is desirable that the MLC substrate be formed with vias and lines densified in accordance with the corresponding microminiaturization of the integrated circuit developments. Such microminiaturization is desirable in order that the package be compatible with the corresponding densified integrated circuit device chips mounted thereon. In such application the MLC substrate must be provided on the top surface with many small pads which are capable of making registered electrical contact with corresponding closely spaced semiconductor device terminals, e.g. solder mounds. In order to more efficiently use the modern integrated circuit technology, as many as possible integrated circuit devices are supported on and interconnected within the MLC substrate. Such an arrangement keeps the distances between interconnected devices small and thereby minimizes the time it takes for electrical signals to travel between the interrelated devices. Also this reduces the number of electrical connections which must be made thereby reducing the cost of the package and increases reliability. The end result is a highly complex MLC package with a lot of small internal printed circuitry contained in a substrate carrier capable of mounting large numbers of integrated circuit devices.

Further, such MLC substrates require a relatively complex metallurgy on the topside to make electrical connection to integrated circuit devices and to provide engineering change pads, and on the bottom side to make connection to the I/O pads, pins or other type connections. When green ceramic is sintered there is normally a 17 to 20% shrinkage. Frequently, the shrinkage is not uniform throughout the MLC substrate. Since the substrate is relatively large, and the metallurgy geometry quite small, it is difficult and frequently impossible to produce a mask for coating protective diverse metals on the substrate metallurgy, that is 17 to 20% smaller than the original substrate that will have all open areas that will coincide or register with the substrate metallurgy. Such a mask is necessary for depositing additional metallurgy metals using conventional masking techniques. Usually the original metallurgy pattern on the MLC substrate laminate deposited prior to sintering and comprises a refractory (for example molybdenum) metalliferous paste screened on the laminate sheets. After sintering, the refractory metal (e.g. molybdenum, tungsten, etc.) must not only be protectively covered with different metals, as for example nickel, chromium, copper, gold, etc., but also to facilitate the making of connections, as by soldering, to semiconductor devices, compression bonding to wires and/or brazing to I/O pins. The protective coating of the refractive MLC substrate metallurgy, where molybdenum is employed is important, since molybdenum is susceptible to reactive corrosion when exposed to humidity of any pH value at operating potentials common in MLC module or substrate applications. This corrosion interrupts conductors, and leads to module failure.

One method of protecting the substrate metallurgy is by covering them with diverse metals, e.g. nickel, by electroless plating techniques which do not require masks. However, such coatings are usually thin and may contain impurities such as phosphorous boron, etc., which may be objectionable in subsequent joining (e.g. soldering, brazing, compression bonding, etc.).

The protective metal layers can also be deposited by electroplating techniques. However, such plating techniques require electrical connection to each area to be plated, whereas in MLC substrates such connections are not always available, since some pads or portions of the metallurgy pattern can be "electrically floating".

These electroless and electroplating techniques are expensive time consuming and difficult to control; and thus there is a need for a maskless plating technique which is simple with elimination of processing steps as well as having a significant improvement in yield without problems of phosphorous and/or boron contamination.

DISCLOSURE OF INVENTION

In accordance with this invention, we provide a process of selectively coating the refractory metal pattern on the substrate without the use of masks with suitable alloy coatings to enable further brazing and soldering to these features, which process involves depositing by such techniques as vacuum evaporation or sputtering over the entire substrate surface discrete layers of two metals which can form a continuous series of solid solutions whose solidus temperatures lie between the melting temperatures of the pure metals, the metal with the lower melting point being deposited first, heating the substrate at a suitably fast heating rate to slightly above the melting point of the metal of the lower melting point to cause this layer to melt and wet to the surfaces of the refractory metal features and concurrently, to dewet from the ceramic surface, cooling to room temperature and selectively removing the now nonadhering metal coating on the bare ceramic regions of the substrate surface by subjecting the surface to the action of intense ultrasonic vibrations in an inert liquid medium such as water, leaving a strongly adherent coating of an alloy of the two metals deposited only on the refractory metal features. Apart from the solid solution behavior noted above, the choice of the two metals is governed by (i) the need for good wetting and bonding of the lower melting metal to the refractory metal surfaces and (ii) the need to ensure that the resulting alloy coating provides for joining to these features through the use of common, low temperature braze and solder alloys. It is to be understood that although the ultrasonic vibration technique is the preferred method for selectively removing the nonadherent metal layer from the ceramic surface after the heat treatment step, other techniques such as light scrubbing with a brush or vapor blasting can also be used to accomplish this.

Although many binary alloy systems satisfy the criterion for the solid solution behavior of the type noted above, illustrative of two such systems are Cu-Pd and Cu-Ni are particularly suited for this application because (i) molten copper wets molybdenum very well, forming a strong braze bond to it and (ii) the resulting alloys are easily joined to using common brazing and soldering alloys. As a special case, we can also obtain a single metal coating, e.g. of copper, as opposed to an alloy coating by first depositing copper on the substrate followed by depositing a thin coating of a refractory metal such as molybdenum, which does not form any intermetallics or solid solutions with copper, heat treating as above to slightly above the melting point of copper, removing the nonadhering metal film on the ceramic by ultrasonic agitation followed by selectively etching off the molybdenum layer from the adhering copper surface using a suitable etchant.

The principles of the method will now be illustrated by taking the examples of the metals copper (melting point 1083° C.) and palladium (melting point 1575° C.). After thoroughly cleaning the substrate surface to be rid of any oil films by standard degreasing methods, a layer of copper (1-3 $\mu$m) is first deposited over its entire surface followed by a layer of palladium (1-3 $\mu$m) in the same pumpdown in an E-beam evaporator. The substrate is then heated in a nitrogen or forming gas ambient to 1100° C. at a heating rate of at least 5° C./min., held at this temperature for 5 minutes and cooled at a convenient rate to room temperature. During the heating stage of this heat treatment, interdiffusion between copper and palladium layers takes place giving rise to a series of solid solutions ranging in composition from pure palladium at the top to pure copper at the bottom closest to the substrate surface. The heating rate used is such that, for the thicknesses of the metal layers chosen, when the maximum heat treating temperature is reached the composition of the metal layer adjacent to the substrate surface will be either pure copper or a dilute alloy of palladium in copper whose solidus temperature is exceeded by the chosen peak heat treating temperature. Under these circumstances a thin liquid metal zone is formed next to the substrate surface during the heat treatment with at least the top layers of the composite film remaining solid. The formation of this captive liquid zone instantaneously causes it to wet the molybdenum surfaces and concurrently to dewet from the bare ceramic surface. After this is accomplished, longer holding at the peak temperature would merely tend to homogenize the composition through the composite film without undoing the selective bonding (to the refractory metal features) and debonding (from the bare ceramic) that had already occurred. The upper bound for the peak heat treatment temperature chosen should be such that the solidus temperature of the completely homogenized copper-palladium alloy should be safely above this temperature so as not to melt the entire film. Upon cooling the substrate to room temperature a continuous copper-palladium alloy film will exist on the substrate surface, this film adhering strongly to the refractory metal features on this surface while staying nonadhering to the bare ceramic in the manner of a conventional decal. Upon subjecting this surface to the action of intense ultrasonic vibrations in an inert medium such as water, the nonadherent portions of the film quickly break off from the adherent regions and fall off from the ceramic surface leaving only the self-aligned, adherent alloy coating on the refractory metal featues. This is how the objective of selectively coating of the refractory metal features on the substrate surface with an adherent coating of a copper-palladium alloy conducive to joining to associated elements through the use of common, low temperature brazing and soldering alloys, was achieved without using any selective masking steps.

The essential condition for the success of this process is the promotion of selective adhesion of the deposited films to the refractory metal features on the substrate surface while concurrently causing this film to debond from the bare ceramic surface. To bring this about the following conditions were needed: (i) The choice of two suitable metals of widely differing melting points which form a continuous series of solid solutions whose solidus curve lies intermediate between the melting points of the two component metals, (ii) The first metal to be deposited on the substrate surface should be the metal whose melting point is lower of the two, and which in the molten state wets well the refractory metal to be coated, (iii) The thicknesses of the deposited layers and the heating rate chosen being such as to ensure the formation of a temporary liquid layer next to the substrate surface at or below the peak heat treatment temperature while the top portions of the composite film remains unmolten, (iv) The relative thicknesses of the metal layers are chosen to ensure that the solidus temperature of the completely homogenized alloy stays safely above the peak heat treating temperature and (v) The total thickness of the coating, while chosen to be adequate for subsequent joining of associated elements to the refractory metal features, should not be excessive so as not to need excessive times of ultrasonic vibration exposure for the removal of the parts of the film rendered nonadherent to the bare ceramic surface by the heat treatment.

BRIEF DESCRIPTION OF THE DRAWINGS

In the accompanying drawings forming a material part of the disclosure.

DESCRIPTION OF PREFERRED EMBODIMENTS

For further comprehension of the invention, and of the objects and advantages thereof, reference will be had to the following description and accompanying drawings and to the appended claims in which the various novel features of the invention are more particularly set forth.

Figure 1:
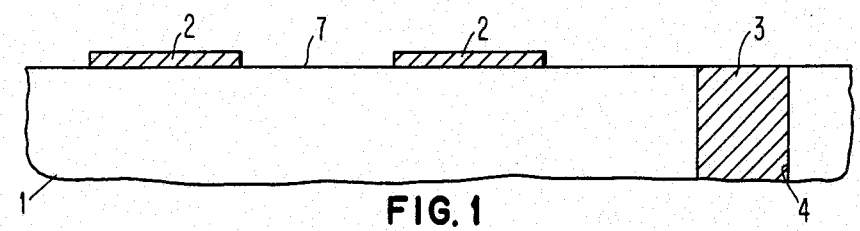
FIGS. 1 to 5 show schematically in cross-sectional views, and broken sections, various stages of the method of this invention.
Figure 2:
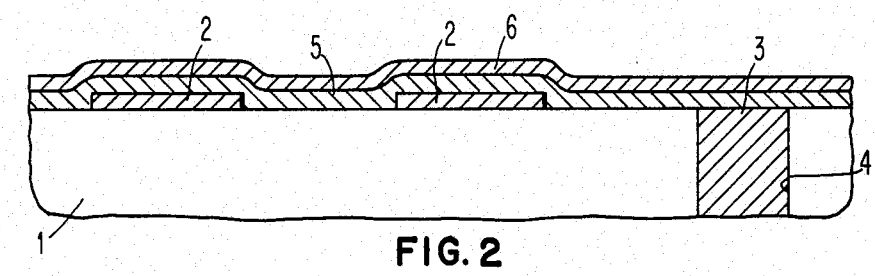
Figure 3:
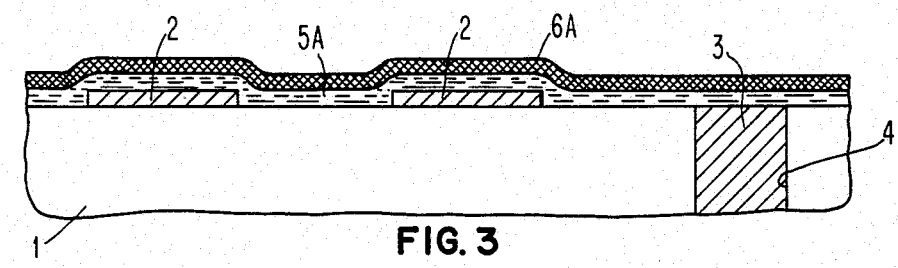
Figure 4:
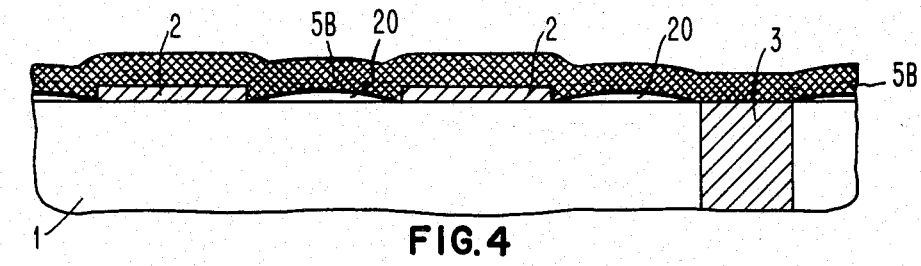

Referring to FIG. 1, there is depicted a fired ceramic substrate 1, typically a multilayered ceramic substrate which can be produced by the method described in detail in U.S. Pat. No. 3,518,756. Although FIGS. 1 to 5 are illustrated in broken section, the internal metallurgical conductor pattern is not shown since it does not constitute a material part of the invention. Also, it is to be understood, however, that substrate 1 need not be a multilayer ceramic substrate, but could be solid with the metallurgical layers formed entirely on the surfaces. The material of substrate 1 is normally formed of alumina, or alumina plus other materials (such as glass), or a ceramic glass material. On the surface of substrate 1, there is shown metallurgy areas 2 and 3 (of via hole 4) which are normally formed of a refractory metal (such as a molybdenum based metal) which was deposited prior to sintering of substrate 1.

For one embodiment of this invention, the substrate 1, inclusive of metallurgy circuit features 2 and 3, are blanket coated to a thickness of about 2 to about 5 $\mu$m, as by sputtering and vacuum evaporation, with a low melting point metal (e.g. copper M.P. 1083° C.). The low melting point layer 5, is in turn suitably coated with a blanket layer 6 of a higher melting point metal to a thickness of about 2 to about 5 $\mu$m. The metal of layer 6 can be any suitable higher melting metal such as palladium, platinum, and nickel which form a continuous series of solid solutions with copper with the solidus points of all such solid solutions lying intermediate between the melting point of copper (1083° C.) and the melting point of the metal chosen for layer 6. Also, the top metal layer 6 can also comprise a refractory metal such as molybdenum, tungsten and the like. It is only necessary that the low melting point bottom metal layer 5 which will, in its liquid form wet the circuit features 2 and 3, and dewet the bare or unpatterned surface areas 7 of substrate 1.

For example, considering a palladium (6)/copper (5) system, the composite metal 5/6 coated substrate is then heated to a temperature between the melting points of the bottom and top (5 and 6) layer metallization, whereby the top layer 6 becomes a nonliquid solid palladium-rich alloy 6A film sandwiching against substrate 1, a captive copper-rich liquid zone 5A formed of the molten layer 5. For a system utilizing a bottom copper layer 5 and a top palladium or nickel layer 6, the substrate can be heated to about 1100°-1140° C.

With the use of a refractory metal, such as molybdenum for top layer 6 in conjunction with a bottom copper layer 5, the structure can be heated to about 1100° C. Although the temperature of the heat treatment will vary with the system of the top and bottom layers 5/6, it can extend in the range from the melting point of the metal of layer 5 to the solidus temperature of the alloy formed by the complete inter-mixing of layers 5 and 6.

During heat treatment the molten bottom metal layer 5A brazes or bonds to the molybdenum circuit features 2 and 3, while dewetting the unpatterned surface areas 7 of substrate 1, on contact therewith where it debonds at 20, on cooling from the substrate surface. The solidifed copper-rich liquid alloy 5A is identified as copper-rich solid alloy layer 5B.

After cooling, the alloyed metalization of bottom and top layers 5 and 6 now alloy layer 10 comprised of layers 5B/6A (see FIG. 5), can be suitably removed as by sand blasting and wire brushing, or by subjecting the substrate to an ultrasonic cleaning operation or other suitable medium, in a conventional tank type of ultrasonic cleaner having side and/or bottom mounted transducers.

In the absence of the more refractory palladium layer or the copper layer, the latter would be completely molten at the peak heat treating temperature and would freely flow on the uneven surface of the substrate forming puddles bridging over closely spaced refractory metal features at the low spots on this surface, these bridges remaining as solid copper bridges across these features upon cooling. The molten copper will also form a multitude of small spherical droplets on the ceramic surface which will remain as copper spheres tenaciously attached to the asperities on the ceramic surface. Thus the presence of the more refractory palladium (or nickel) over the liquid metal layer during the heat treatment (Fig. 3) acts to prevent the latter's tendency for lateral flow on the substrate surface, as well as to prevent the balling up of the molten copper on the ceramic because it will remain spread on the solid metal crust. If during the heat treatment no liquid zone is formed, which can happen if the peak heat treatment temperature attained is below the melting temperature of the alloy composition closest to the ceramic surface at the instant of reaching that temperature, no selective bonding of the film to the molybdenum surface will occur. Such a condition could arise if (i) the heating rate is so slow as to allow considerable penetration of palladium into the region of the copper layer adjacent to substrate surface prior to attaining the peak heat treating temperature (ii) the thickness of the copper layer is not adequate for the heating rate employed, to prevent excessive palladium penetration into the copper layer prior to reaching the peak temperature for the heating rate employed. Thus the critical heating and the copper layer thickness are interdependent. These also depend on the rate of change of the solidus temperature with composition (i.e., the slope of the solidus curve) on the copper-rich side of the binary phase diagram for the two metals and on their interdiffusion rates. Thus, the gentler slope of the solidus curve in the copper-palladium system would allow for a greater degree of palladium penetration into copper layer prior to reaching the peak heat treating temperature, than in the case of the copper-nickel system which exhibits a steeper solidus curve.

The relative thicknesses of the copper and palladium (nickel) layers should be so chosen as to enssure that the solidus temperature of the completely homogenized alloy that will result from their eventual, complete mixing be safely above the peak temperature chosen for the heat treatment to prevent its complete melting at this temperature. In the case where the top layer chosen is such that it does not form any intermetallics or solid solution with the layer below (e.g., molybdenum over copper), the top layer thickness need only be sufficient to prevent the breakout of the molten copper through it during the heat treatment. The mechanism of film removal involves the rupturing of the loose composite metal films 10 from the substrate areas by the action of the shock waves impinging on the surfaces. The shock waves being induced by bubble collapse (cavitation) within the liquid medium during the ultrasonic action. One preferred form of removing the loose composite metal film 10 is by use of an ultrasonic horn to focus and deliver very high local intensities of energy (about 100 watts per cm$^2$) and by utilizing the near field characteristics of the ultrasonic field close (e.g. about 1 to about 10 mm) to the horn surface where cavitation plays only a minor role. In such an arrangement, the removal of the loosely adherent composite metal films 10 from the substrate surface is very efficient. For example, non-adhering copper palladium films of 5 μm thickness can be removed from alumina ceramic surfaces in about 5 to about 30 seconds.

Figure 5:
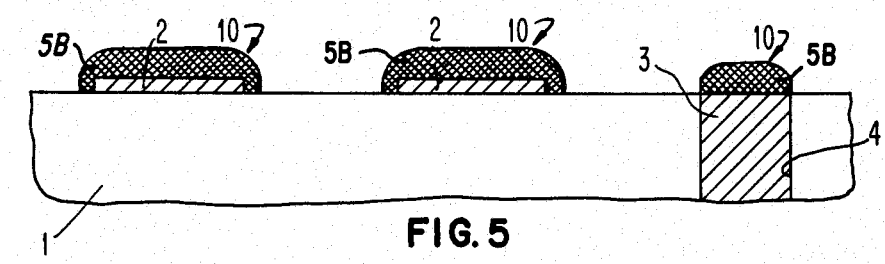

It is believed that the mechanism of metal film removal is as follows: In the near-field region, there exists a coupling of the ultrasonic field (generated by the transducer) to the surface of the substrate carrying the metal film. Where the composite metal film 10 is strongly adhering to the substrate, such as in areas of the pre-existing metallurgical circuit features under the film, the ultrasonic energy is merely transmitted through the composite metal film 10 into the substrate and dissipated. Where the composite metal film 10 is non-adhering, such as on the bare substrate surface areas, the ultrasonic energy is substantially absorbed by the thin composite metal film 10, causing it to vibrate with the field. This vibration generates alternating stresses at points of the film where it adheres to the substrate which eventually causes the film breakage at these points. High frequencies (e.g. 10–40KHz) of the field ensures that from $10-40 \times 10^3$ cycles of alternating stress is applied to the metal film 5 at the boundaries of adhering regions so that the fatigue limit for the film is reached in 1 to 30 seconds depending on the nature of the metal film, its thicknesses, and the distance between adjacent adhering areas. With the complete removal of the non-adhering metal film 5 from the substrate surfaces, only the pre-existing metallurgical circuit features 2 on the substrate will retain an adherent metal film 10, as shown in FIG. 5.

Where a refractory metal is employed as the top layer 6, it can be removed from the final structure, where desired or required, by suitable wet or dry etching techniques.

Where limitations of heating furnaces and heat-up and cool-down present problems of temperature exposures, one effective method of heating is by E-beam. Use of an E-beam will heat the substrate to temperature very quickly with subsequent rapid cooling. Illustratively, the structure can be heated with a pulsed electron beam or laser beam to locally heat up the metal layers and cause melting of the bottom metal layer 5 in small areas in a very short time. Since the heat duration is quite small, the MLC substrate should not feel appreciable thermal shock. After the E-beam or laser heat treatment, the unwanted regions (e.g. over the unpatterned surface areas 7 of substrate 1) can be removed by various techniques.

Illustratively for Cu-Pd alloy capping of the circuit features 2 and 3, a 2 μm film of copper was used for bottom layer 5 with a blanket coating of 1 μm of palladium for the top layer 6, the unit was heat treated to 1100° C. in a forming gas ambient as follows:

2½ hours heating time to 1100° C.
5 minutes hold at 1100° C.
Furnace, off to cool The substrate was subsequently cleaned ultrasonically to completely remove the non-adhering alloy film on the unpatterned surface areas 7 of an alumina ceramic substrate 1. An adherent Cu-Pd alloy cladding remained on the molybdenum circuit features 2 and 3.

While the invention has been particularly shown and described with reference to the preferred embodiments thereof, it will be understood by those skilled in the art that the foregoing and other changes in form and detail may be made therein without departing from the spirit and scope of the invention.

What is claimed is:

1. A method for selectively depositing brazeable and solderable coatings over an existing metallurgical pattern on surfaces of a dielectric substrate comprising:

(A) sequentially blanket coating said substrate, inclusive of said pattern, with two discrete levels of diverse metals having a differential in melting points and forming alloy systems of said metals with alloys thereof brazeable and solderable, bondable to said pattern, and non-wetting to the bare surfaces of said substrate wherein said diverse metals form a continuous series of solid solutions whose solidus curve lies intermediate the melting points of the substantially pure component metals, said blanket coating carried out so that the metal having the lower melting point is disposed adjacent said substrate, and using a thickness of the deposited metals that in conjunction with the heating rate of subsequent step (B) allows formation of a temporary liquid layer next to the substrate surface at or below the peak heat treatment temperature while the top portions of the composite film remain unmolten;

(B) heating said substrate at said heating rate to a temperature above the melting point of the lower melting component metal but not exceeding the solidus temperature of any resultant completely homogenized alloy corresponding to the amounts of metals deposited;

(C) cooling said substrate to (a) solidify said liquid layer, delaminate the solidified composite metal film on the bare surfaces of said substrate and (c) concurrently bond said solidified liquid layer to said pattern to form a brazeable or solderable coating thereon; and (D) removing said delaminated composite film from the bare surface areas of said substrate to retain a bonded cladding comprised of said metals on said metallurgical pattern.

2. The method of claim 1 wherein said delaminated composite film is ultrasonically removed from said bare substrate surface areas.

3. The method of claim 1 when said metallurgical pattern is comprised of a refractory based metal.

4. The method of claim 3 wherein the refractory metal is selected from the group consisting of moybdenum and tungsten.

5. The method of claim 1 wherein said dielectric substrate is comprised of an alumina based ceramic.

6. The method of claim 5 when said metallurgical pattern is comprised of a refractory metal.

7. The method of claim 6 wherein the refractory metal is comprised of molybdenum.

8. The method of claim 7 wherein said delaminated composite film is ultrasonically removed from said bare substrate surface areas.

9. The method of claim 7 wherein the substrate adjacent metal is selected from the group consisting of copper, nickel, nickel/palladium alloy and copper/palladium alloy.

10. A method for selectively depositing a solderable and brazeable coating over an existing metallurgy pattern on the surfaces of a dielectric substrate comprising:

(A) depositing a blanket coating of a first metal layer over said substrate, inclusive of said pattern, with said first metal layer having a melting point lower than said pattern and adherent thereto;

(B) depositing a blanket coating of a second metal layer over said first metal layer, with (a) said second metal layer having a melting point higher than that of said first metal layer, (b) said second metal layer selected to preclude formation of intermetallics or solid solutions with said first metal layer, and with said first metal bondable to said pattern and non-wetting to the bare surface of said substrate;

(C) heating said substrate to below the melting point of said second metal layer and above that of said first metal layer for selective melting thereof, with said first metal bonding to said pattern to form a brazeable or solderable composition thereon;

(D) cooling said substrate to solidify said metal coating on said pattern with bonding thereto and to, concurrently, delaminate the metal coating on the bare surfaces of said substrate; and (E) removing said first and second metal layers from the unpatterned surface areas of said substrate.

11. The method of claim 10 wherein the second metal layer is comprised of a refractory metal, and including the additional step, subsequent to steps (D), of selective removal thereof from the cladding on said pattern.

12. The method of claim 10 wherein said metal layers are removed ultrasonically from the unpatterned surface areas of said substrate.

13. The method of claim 10 wherein said substrate is comprised of an alumina based ceramic, and said pattern is comprised of molybdenum.

14. The method of claim 13 wherein said first metal layer is selected from the group consisting of copper, nickel and gold based metals.

15. The method of claim 14 wherein the second metal layer is comprised of a refractory metal, and including the additional step subsequent to step (D) of selective removal thereof from the cladding on said pattern.

16. The method of claim 14 wherein said metal layers are removed ultrasonically from the unpatterned surface areas of said substrate.

17. The method of claim 14 wherein said second metal layer is comprised of a refractory metal.

18. The method of claim 17 wherein the second metal layer is comprised of a refractory metal, and including the additional step, subsequent to step (D), of selective removal thereof from the cladding on said pattern.

19. The method of claim 17 wherein said metal layers are removed ultrasonically from the unpatterned surface areas of said substrate.

* * * * *